(12) United States Patent
Asaduzzaman et al.

(10) Patent No.: US 7,532,029 B1
(45) Date of Patent: May 12, 2009

(54) TECHNIQUES FOR RECONFIGURING PROGRAMMABLE CIRCUIT BLOCKS

(75) Inventors: Kazi Asaduzzaman, Fremont, CA (US); Leon Zheng, Santa Clara, CA (US); Sergey Shumarayev, Los Altos Hills, CA (US); Tim Tri Hoang, San Jose, CA (US)

(73) Assignee: Altera Corporation, San Jose, CA (US)

( * ) Notice: Subject to any disclaimer, the term of this patent is extended or adjusted under 35 U.S.C. 154(b) by 0 days.

(21) Appl. No.: 11/737,079

(22) Filed: Apr. 18, 2007

(51) Int. Cl.
*H03K 19/173* (2006.01)
*H03L 7/00* (2006.01)

(52) U.S. Cl. .................. 326/38; 326/16; 327/147
(58) Field of Classification Search ............ 326/37–41, 326/47, 16; 327/147, 156
See application file for complete search history.

(56) References Cited

U.S. PATENT DOCUMENTS

| | | | |
|---|---|---|---|
| 6,208,162 B1 * | 3/2001 | Bocchino | 326/38 |
| 6,897,678 B2 * | 5/2005 | Zaveri et al. | 326/39 |
| 6,920,416 B1 * | 7/2005 | Swoboda et al. | 703/13 |
| 6,933,761 B2 | 8/2005 | Chang | |
| 2005/0200390 A1 | 9/2005 | Starr et al. | |

OTHER PUBLICATIONS

"Stratix II GX Device Handbook, vol. 2: PLLs in Stratix II & Stratix II GX Devices," Altera Corporation, Dec. 2005, pp. 5-1 through 5-90.

* cited by examiner

*Primary Examiner*—James H Cho
(74) *Attorney, Agent, or Firm*—Steven J. Cahill

(57) ABSTRACT

Techniques are provided for dynamically reconfiguring programmable circuit blocks on integrated circuits during user mode. First configuration bits are loaded from first configuration scan registers into second configuration scan registers during configuration mode. The first configuration bits are used to configure programmable settings of a programmable circuit block. During user mode, second configuration bits are transmitted from a pin to the second configuration scan registers without transferring the second configuration bits through the first configuration scan registers. The second configuration bits are used to reconfigure the programmable settings of the programmable circuit block during the user mode. Also, phase shift circuitry can dynamically shift the phase of an output clock signal by selecting a different input clock signal. The phase shift circuitry has a delay circuit that allows the phase of a high frequency clock signal to be shifted without causing glitches in the clock signal.

21 Claims, 10 Drawing Sheets

TECHNIQUES FOR RECONFIGURING PROGRAMMABLE CIRCUIT BLOCKS

BACKGROUND OF THE INVENTION

The present invention relates to electronic circuits, and more particularly, to techniques for reconfiguring programmable circuit blocks.

Phase-locked loops (PLLs) are an essential building block of many integrated circuits, providing periodic signals for data recovery, data transfer, and other clocking functions. PLLs often supply a clock signal to one or more counters or dividers that divide a signal from an oscillator to a lower frequency clock signal for distribution around an integrated circuit or system. PLLs can have a voltage controlled oscillator, a current controlled oscillator, or a digitally controlled oscillator.

A programmable logic integrated circuit (IC), such as a field programmable gate array (FPGA) or a programmable logic device (PLD), typically contains programmable logic circuit blocks that can configured to perform a variety of functions. Some programmable ICs also include PLLs that have configurable settings.

When used inside a programmable logic IC, a PLL can have many configurations. Each configuration defines a specific application use in the user mode of the programmable logic IC. The requirements for input and output frequency, bandwidth, phase relationship, jitter budget, and many other feature requirements trigger a unique configuration for a PLL.

After a FPGA chip has been programmed, and a different configuration is needed, a new configuration is loaded into the chip. Loading a new configuration forces the chip to go out of user mode. As a result, the functionality of the system gets disrupted.

Therefore, it would be desirable to provide phase-locked loops that can be reconfigured without exiting user mode.

BRIEF SUMMARY OF THE INVENTION

According to some embodiments of the present invention, techniques are provided for dynamically reconfiguring programmable circuit blocks on integrated circuits during user mode. First configuration bits are loaded from first configuration scan registers into second configuration scan registers during configuration mode. The first configuration bits are used to configure programmable settings of the programmable circuit block.

During user mode, second configuration bits are transmitted from a pin to the second configuration scan registers without transferring the second configuration bits through the first configuration scan registers. The second configuration bits are used to reconfigure the programmable settings of the programmable circuit block during the user mode.

According to other embodiments of the present invention, phase shift circuitry can dynamically shift the phase of an output clock signal by selecting a different input clock signal. The phase shift circuitry has a delay circuit that allows the phase of a high frequency clock signal to be shifted without causing glitches in the clock signal.

Other objects, features, and advantages of the present invention will become apparent upon consideration of the following detailed description and the accompanying drawings.

DETAILED DESCRIPTION OF THE INVENTION

Figure 1A:
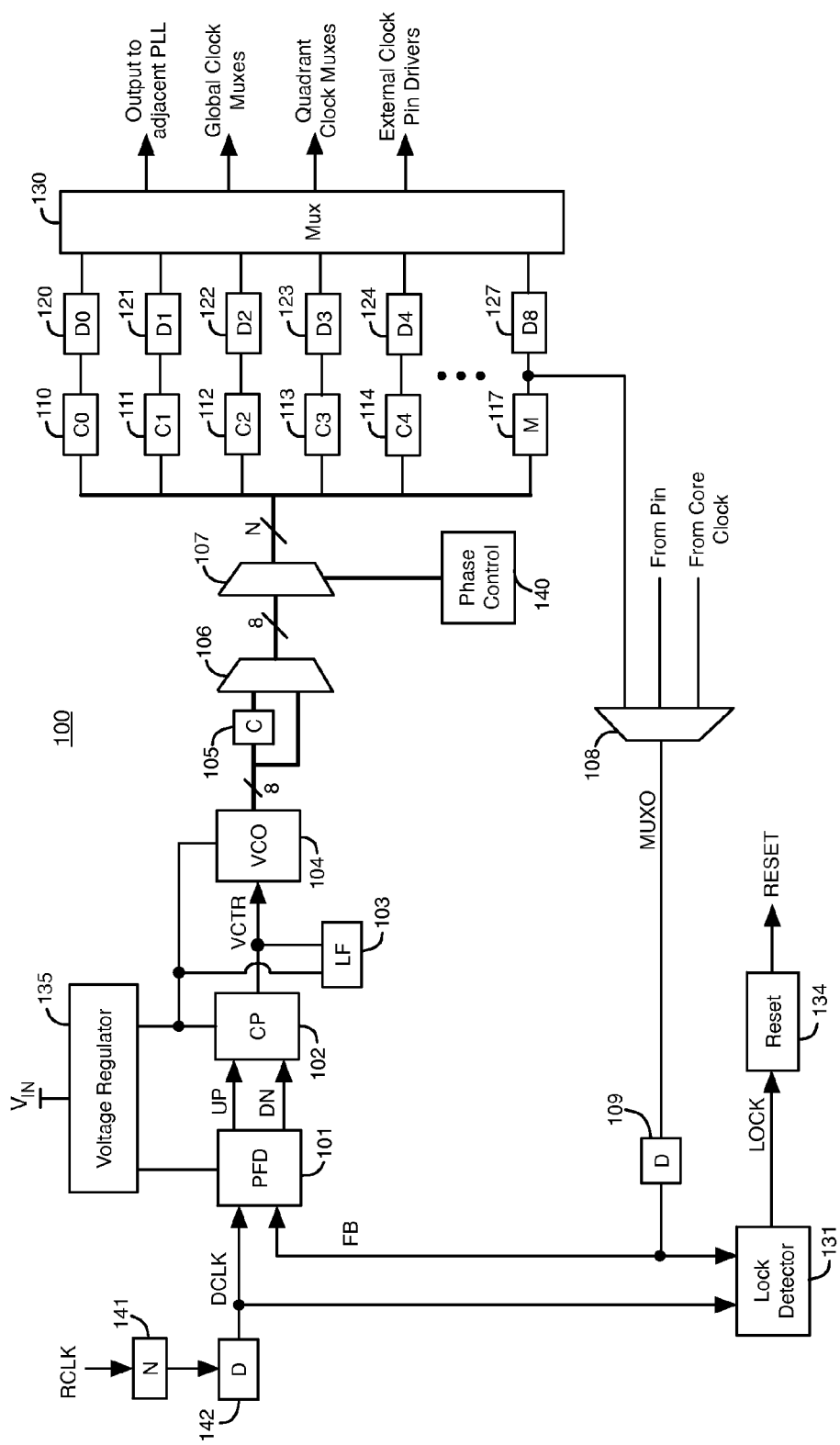
FIG. 1A illustrates a phase-locked loop (PLL) circuit with a dynamic phase shift feature, according to an embodiment of the present invention.

FIG. 1A illustrates a phase-locked loop (PLL) 100, according to an embodiment of the present invention. An input N counter circuit 141 receives an input reference clock signal RCLK at its input. RCLK is a periodic input signal. Counter 141 divides the frequency of RCLK by a frequency divider ratio N to generate an output signal. Delay circuit 142 delays the output signal of counter circuit 141 to generate clock signal DCLK. Delay circuit 142 has a programmable delay. The delay of delay circuit 142 can be programmed to compensate for any offsets in PLL 100.

The divided and delayed clock signal DCLK is transmitted to a first input of a phase frequency detector (PFD) 101. PFD 101 compares the phase and frequency of clock signal DCLK to the phase and frequency of a feedback clock signal FB to generate pulses in UP and DN output signals.

The UP and DN signals are transmitted to inputs of charge pump (CP) circuit 102. PFD 101 generates longer high pulses in the UP signal when the frequency of clock signal DCLK is higher than the frequency of feedback clock signal FB. PFD 101 generates longer high pulses in the DN signal when the frequency of feedback clock signal FB is higher than the frequency of clock signal DCLK.

CP 102 controls its output voltage VCTR in response to the UP and DN signals. The output voltage VCTR of charge pump 102 is low pass filtered by loop filter (LF) 103. CP 102 sends more charge to loop filter 103 in response to high pulses in the UP signal. CP 102 drains charge from loop filter 103 in response to high pulses in the DN signal. When high pulses in the UP signal are longer than high pulses in the DN signal, voltage VCTR increases. When high pulses in the UP signal are shorter than high pulses in the DN signal, voltage VCTR decreases.

The output voltage VCTR of LF block 103 is transmitted to an input of voltage-controlled oscillator (VCO) 104. VCO 104 is a 4-stage VCO generating 8 periodic output signals that are equally spaced 45 degrees apart from each other. The 8 periodic output signals of VCO 104 have relative phase shifts of 0°, 45°, 90°, 135°, 180°, 225°, 270°, and 315°. The output voltage VCTR of LF 103 determines the frequency of the periodic output signals of VCO 104.

PFD 101, CP 102, LF 103, and VCO 104 each receive a power supply voltage from voltage regulator 135. Voltage regulator 135 is a DC/DC converter that converts an input voltage $V_{IN}$ into regulated power supply voltages that drive PFD 101, CP 102, LF 103, and VCO 104.

One of the periodic output signals of VCO 104 feeds back to PFD 101 as the feedback clock signal FB through multiplexers 106-107, feedback M counter 117, multiplexer 108, and delay circuit 109. VCO 104 varies the frequency its periodic output signals in response to VCTR until the input clock signal DCLK and the feedback clock signal FB are frequency and phase aligned.

PLL 100 is in lock when the input clock signal DCLK and the feedback clock signal FB are frequency and phase aligned. Lock detector 131 senses when PLL 100 is in lock. Lock detector 131 receives the output signal FB of delay circuit 109 and the output signal DCLK of delay circuit 142. Lock detector 131 generates a LOCK output signal that is provided to reset circuit 134. Lock detector 131 generates a logic high in the LOCK signal when the input clock signal DCLK and the feedback clock signal FB are frequency and phase aligned.

According to an embodiment of the present invention, PLL 100 provides an automatic reset feature that causes PLL 100 to automatically reset whenever the frequencies of clock signals DCLK and FB are no longer locked (i.e., no longer frequency and phase aligned). Reset circuit block 134 controls the automatic reset feature of PLL 100. When the LOCK signal transitions from a logic high to a logic low, reset circuit block 134 generates a logic high in the RESET signal. A logic high in the RESET signal causes components in PLL 100 to wake-up in a sequential manner. A reset allows the PLL to re-align the phases of DCLK and FB after the PLL loses lock. The components in PLL 100 that are reset by the RESET signal can, e.g., include PFD 101, CP 102, loop filter 103, VCO 104, and counters 105, 110-114 and 117.

Counter block 105 represents 8 counter circuits that are coupled to receive the 8 periodic output signals of VCO 104. Counter circuits 105 divide the frequencies of the output signals of VCO 104 by a frequency divider ratio (e.g., 2). Multiplexer 106 is coupled to VCO 104, counter block 105, and multiplexer 107. Multiplexer 106 can be programmed to transmit the 8 output signals of counter circuits 105 to 8 inputs of multiplexer 107. Alternatively, multiplexer 106 can be programmed to transmit the 8 output signals of VCO 104 directly to the 8 inputs of multiplexer 107. Multiplexer 106 can represent 8 separate multiplexers, one for each of the VCO output signals.

Multiplexer 107 couples the 8 outputs of multiplexer 106 to a number N of counter circuits, including counter circuits 110-114 and 117. PLL 100 can have any number of C output counters 110-114, in addition to a feedback counter M 117. Each of the counter circuits 110-114 and 117 receives one of the output signals of multiplexer 107. The counter circuits 110-114 and 117 are frequency divider circuits. The output signals of counter circuits 110-114 and 117 are delayed by delay circuits 120-124 and 127, respectively.

The output signals of delay circuits 120-124 and 127 are transmitted to inputs of output multiplexer 130. Multiplexer 130 routes output clock signals from PLL 100 to various destinations on the integrated circuit chip. For example, output clock signals from PLL 100 can be routed to an adjacent PLL, global multiplexers, quadrant multiplexers, and external clock pin drivers.

The output signal of feedback M counter 117 is transmitted to an input of multiplexer 108. Multiplexer 108 selectively drives the output signal of counter 117, a clock signal from the core circuitry of the chip, a clock signal from a pin of the chip, or another clock signal to an input of delay circuit 109. Delay circuit 109 transmits the output signal MUXO of multiplexer 108 to the second input of PFD 101 and an input of lock detector 131. The output signal of delay circuit 109 is the feedback clock signal FB. Delay circuit 109 has a programmable delay that can be adjusted to compensate for offsets in PLL 100.

PLL 100 can generate periodic signals having multiple phases that can be selected and generated dynamically. This dynamic phase shift feature is useful for applications such as double-data rate (DDR) transfers and synchronous dynamic random access memory (SDRAM). The dynamic phase shift feature is used to capture DDR-SDRAM data on both the negative and positive edges of the clock signal. The dynamic phase shift feature can be supported for a wide output frequency range with up to 32 phases over one clock period.

The architecture of PLL 100 allows the phases of the output signals of a phase-locked loop to be dynamically adjusted relative to each other and the reference clock signal RCLK. PLL 100 has a 4-stage VCO 104 generating 8 signals that are 45 degrees apart in phase. Multiplexer 107 selectively routes the eight output signals of VCO 104 in response to phase-tap signals from phase control circuit block 140. The phase-tap signals can cause multiplexer 107 to adjust the phases of the VCO output signals that are transmitted to each counter circuit. In a programmable logic integrated circuit, the phase shifting can occur during user mode.

Figure 1B:
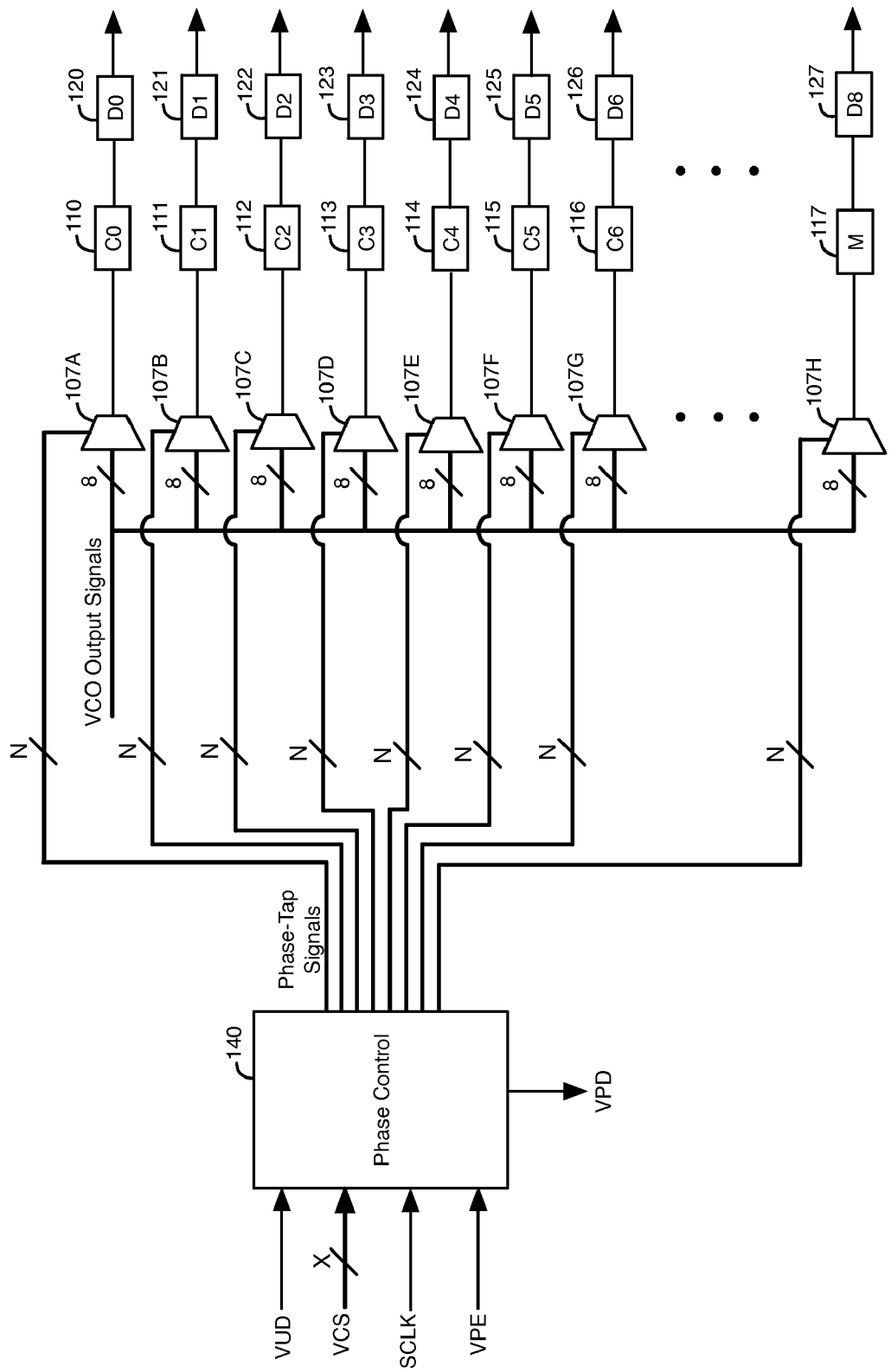
FIG. 1B illustrates additional details of the dynamic phase shift circuitry shown in FIG. 1A, according to a further embodiment of the present invention.

Further details of the phase shift circuitry of PLL 100 are shown in FIG. 1B. Multiplexer 107 in FIG. 1A represents several multiplexer circuits. FIG. 1B, for example, illustrates 8 multiplexers 107A-107H that are part of multiplexer 107. Multiplexers 107A-107H selectively couple one of the 8 VCO output signals from multiplexer 106 to inputs of counter circuits 110-117, respectively. The output signals of counter circuits 110-117 are delayed by delay circuits 120-127, respectively. Delay circuits 120-127 have a programmable delay that can be adjusted to compensate for variable offsets in PLL 100.

Phase control circuit 140 generates multiple sets of phase-tap signals. Eight sets of phase taps signals are shown in FIG. 1B as an example. Each set of the phase tap signals includes an N number of phase tap signals. Each set of the phase tap signals is transmitted to N select inputs of one of multiplexers 107A-107H through a separate set of parallel conductors. The phase tap signals control when the multiplexers 107A-107H shift the phases of their output signals.

Phase control circuit 140 generates the phase-tap signals in response to input signals VUD, VCS, SCLK, and VPE. Phase control circuit 140 receives a set of counter selection signals VCS[0]-VCS[X−1]. Typically, N equals $2^X$. The counter selection signals VCS[0]-VCS[X−1] separately enable or disable the phase tap signals that are transmitted to each multiplexer 107A-107H. Thus, the phase of the output signal generated by each multiplexer 107A-107H can be dynamically shifted independently of the other multiplexers.

For example, if VCS0 is high, and VCS1 is low, the phase-tap signals transmitted to multiplexer 107A are enabled to change state in response to SCLK and VUD, and at the same time, the phase-tap signals transmitted to multiplexer 107B remain constant. As a result, multiplexer 107A can shift the phase of its output signal in response to a change in the phase-tap signals, and multiplexer 107B keeps the phase of its output signal constant.

Phase control circuit 140 also receives a phase enable input signal VPE. Phase control circuit 140 maintains all of the phase-tap signals that are transmitted to multiplexers 107A-107H constant when VPE is a logic low. When VPE is a logic high, phase control circuit 140 allows the phase-tap signals that are selected by the counter selection signals VCS to be adjusted. Phase control circuit 140 generates a phase-done output signal VPD that transitions to a logic high value when any phase shifts caused by changes in the phase-tap signals are completed.

VUD is an up/down signal that controls the direction of phase shift of the output signals of multiplexers 107A-107H. The phases of the multiplexer output signals increase when VUD is in a first logic state and decrease when VUD is in a second logic state. Directional signal VUD and a clock signal SCLK control changes in the phase-tap signals. For example, the logic states of each set of N phase-tap signals can be adjusted on each rising edge of clock signal SCLK when the VPE signal and the corresponding VCS signal are high. The phases of the periodic output signals of multiplexers 107A-107H are dynamically phase shifted in response to changes in the phase tap signals.

Phase control circuit 140 can individually change the phases of the output clock signals of multiplexers 107A-107H by different phase adjustments. For example, the phase of the output clock signal of multiplexer 107A can be adjusted from 0° to 45°, the phase of the output clock signal of multiplexer 107B can be adjusted from 45° to 180°, and the phase of the output clock signal of multiplexer 107C can be adjusted from 90° to 315°.

As another example, the phase of the output clock signal of multiplexer 107A can be adjusted from 90° to 225°, the phase of the output clock signal of multiplexer 107B can be adjusted from 135° to 180°, and the phase of the output clock signal of multiplexer 107C can be adjusted from 180° to 270°.

Each discrete change in the phase-tap signals causes the phases of the output signals of multiplexers 107A-107H to be shifted by ⅛ of the frequency of the VCO output signals. The counters 110-117 accumulate the phase shifts so that a phase adjustment can be made that equals more than one period of the VCO output signals.

The output clock signals of VCO 104 can be separated by 45 degree phase shifts (i.e., ⅛ the period $T_{VCO}$ of the VCO output signals), as described above. Even when VCO 104 generates 8 output clock signals separated by 45 degree phase shifts, PLL 100 can generate output clock signals separated by equally spaced phase shifts that are smaller than 45 degrees. PLL 100 can generate smaller phase shifts by dividing the frequency of the VCO output signal using counters 110-117, etc. For example, the output counters can divide the frequency of each of the 8 VCO output signals by 4 to generate clock signals having 32 equally-spaced phases. As another example, the output counters can divide the frequency of each of the 8 VCO output signals by 2 to generate output signals having 16 equally-spaced phases.

Figure 2A:
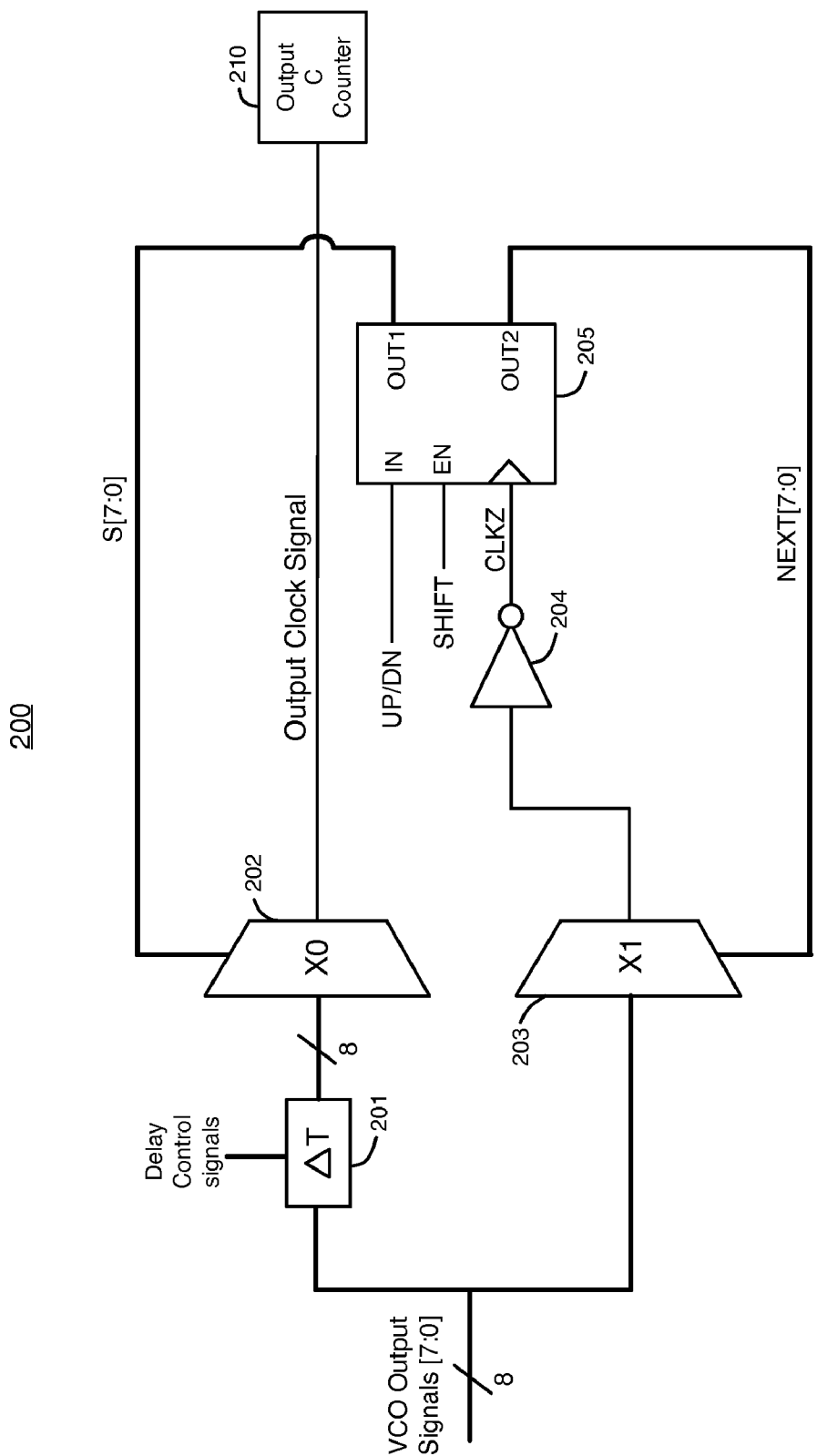
FIG. 2A illustrates circuitry that can be used to dynamically shift the phase of high frequency VCO output signals without causing glitches, according to another embodiment of the present invention.

FIG. 2A illustrates an example of circuitry that can dynamically shift the phase of high frequency VCO output signals without causing glitches, according to another embodiment of the present invention. Phase shift circuit 200 of FIG. 2A includes programmable delay circuit cell 201, 8-to-1 multiplexers 202-203, inverter 204, and barrel shifter 205. According to an embodiment of the present invention, each of the multiplexers 107A-107H shown in FIG. 1B includes the phase shift circuit 200 of FIG. 2A. Output C counter 210 represents one of counters 110-117 in FIG. 1B.

Eight VCO output clock signals [7:0] are transmitted from VCO 104 to phase shift circuit 200 through multiplexer 106. The period of the VCO output clock signals is referred to herein as $T_{VCO}$. The VCO output clock signals are transmitted to inputs of programmable delay cell 201 and multiplexer 203. Programmable delay circuit cell 201 delays the VCO output clock signals to generate 8 delayed VCO output clock signals. The delayed VCO output clock signals are transmitted from delay cell 201 to inputs of multiplexer 202. Programmable delay cell 201 has a variable delay that is determined by the states of a set of delay control signals.

Multiplexer 202 selects one of the delayed VCO output clock signals from delay cell 201 and transmits the selected delayed VCO output clock signal to an input of output C counter 210 as the output clock signal. Multiplexer 203 selects one of the VCO output clock signals and transmits the selected VCO output clock signal to an input of inverter 204. Inverter 204 inverts the selected VCO output clock signal and transmits the inverted VCO signal CLKZ to a clock input of barrel shifter 205.

Multiplexer 203 selects a VCO output clock signal having a phase that is after the phase of the delayed VCO output clock signal selected by multiplexer 202. For example, the phase of the output clock signal of multiplexer 203 can be (⅛)*($T_{VCO}$) after the phase of the output clock signal of multiplexer 202.

Barrel shifter 205 contains a series of flip-flops that are coupled together to perform a barrel shifting function. To prevent glitches on the output clock signal of multiplexer 202, the flip-flops in barrel shifter 205 are clocked with the falling edge of the VCO output clock signal selected by multiplexer 203.

A SHIFT signal is transmitted to an enable input EN of barrel shifter 205. The SHIFT signal initiates the phase shifting. When the SHIFT signal is a logic high, barrel shifter 205 is enabled to commence the barrel shifting function.

Barrel shifter 205 generates 8 select signals S[7:0] that are transmitted to 8 select inputs of multiplexer 202. The states of select signals S[7:0] determine which of the 8 delayed VCO output clock signals that multiplexer 202 transmits to output counter 210. Thus, select signals S[7:0] select the phase for the output clock signal of multiplexer 202.

An UP/DN signal is transmitted to an input IN of barrel shifter 205. The UP/DN signal controls the direction of the barrel shifting and the phase relationship of the new output clock signal of multiplexer 202 relative to the previous output clock signal of multiplexer 202.

Barrel shifter 205 changes the states of the select signals S[7:0] in response to the UP/DN signal, the SHIFT signal, and the clock signal CLKZ from inverter 204 to cause multiplexer 202 to select a different one of the delayed VCO clock signals from delay cell 201. When the SHIFT signal goes high, and the UP/DN signal is high, barrel shifter 205 changes the states of select signals S[7:0] so that the new output clock signal selected by multiplexer 202 is behind the previous output clock signal selected by multiplexer 202. When the SHIFT signal goes high, and the UP/DN signal is low, barrel shifter 205 changes the states of the select signals S[7:0] so that the new clock signal selected by multiplexer 202 is ahead of the previous output clock signal selected by multiplexer 202.

Barrel shifter 205 also generates 8 select signals NEXT[7:0] that are transmitted to 8 select inputs of multiplexer 203. Multiplexer 203 selects one of the 8 VCO output clock signals based on the states of select signals NEXT[7:0]. The VCO output clock signal selected by multiplexer 203 is transmitted to inverter 204. The output clock signal CLKZ of inverter 204 clocks barrel shifter 205. Select signals NEXT[7:0] determine the phase of the clock signal CLKZ that is used to clock the flip-flops in barrel shifter 205.

When the Shift signal goes high, barrel shifter 205 changes the states of the select signals S[7:0], and at the same time, barrel shifter 205 changes the states of the NEXT[7:0] signals. Each change in the states of the NEXT[7:0] signals causes multiplexer 203 to adjust the phase of clock signal CLKZ by ⅛ of a clock cycle after the phase of the currently selected clock signal.

The critical path for the phase shifting is the delay through multiplexer 203 plus the delay through the flip-flops in barrel shifter 205. When this delay is greater than, for example, ⅜ of the VCO clock period $T_{VCO}$, multiplexer 202 may switch between VCO clock signals after the rising edge of the newly selected VCO clock signal, possibly causing the output clock signal of multiplexer 202 to have a glitch. Glitches in the output clock signal can cause the feedback counter and the output counters in the PLL (e.g., counter 210) to generate false clocking. The delay of multiplexer 203 and barrel shifter 205 can be greater than ⅜*$T_{VCO}$ when the VCO output signals have higher frequencies.

According to an embodiment of the present invention, phase shift circuit 200 uses programmable delay cell 201 to compensate for the critical path through multiplexer 203 and barrel shifter 205. For example, the delay control signals can be set to select a delay for delay cell 201 that causes the delay through delay cell 201 plus the delay through multiplexer 202 to be equal to (or greater than) the delay through multiplexer 203 plus the delay through the flip-flops in barrel shifter 205. As a result, programmable delay cell 201 allows phase shift circuit 200 to support VCO output clock signals having much higher frequencies, without causing glitches.

Figure 2B:
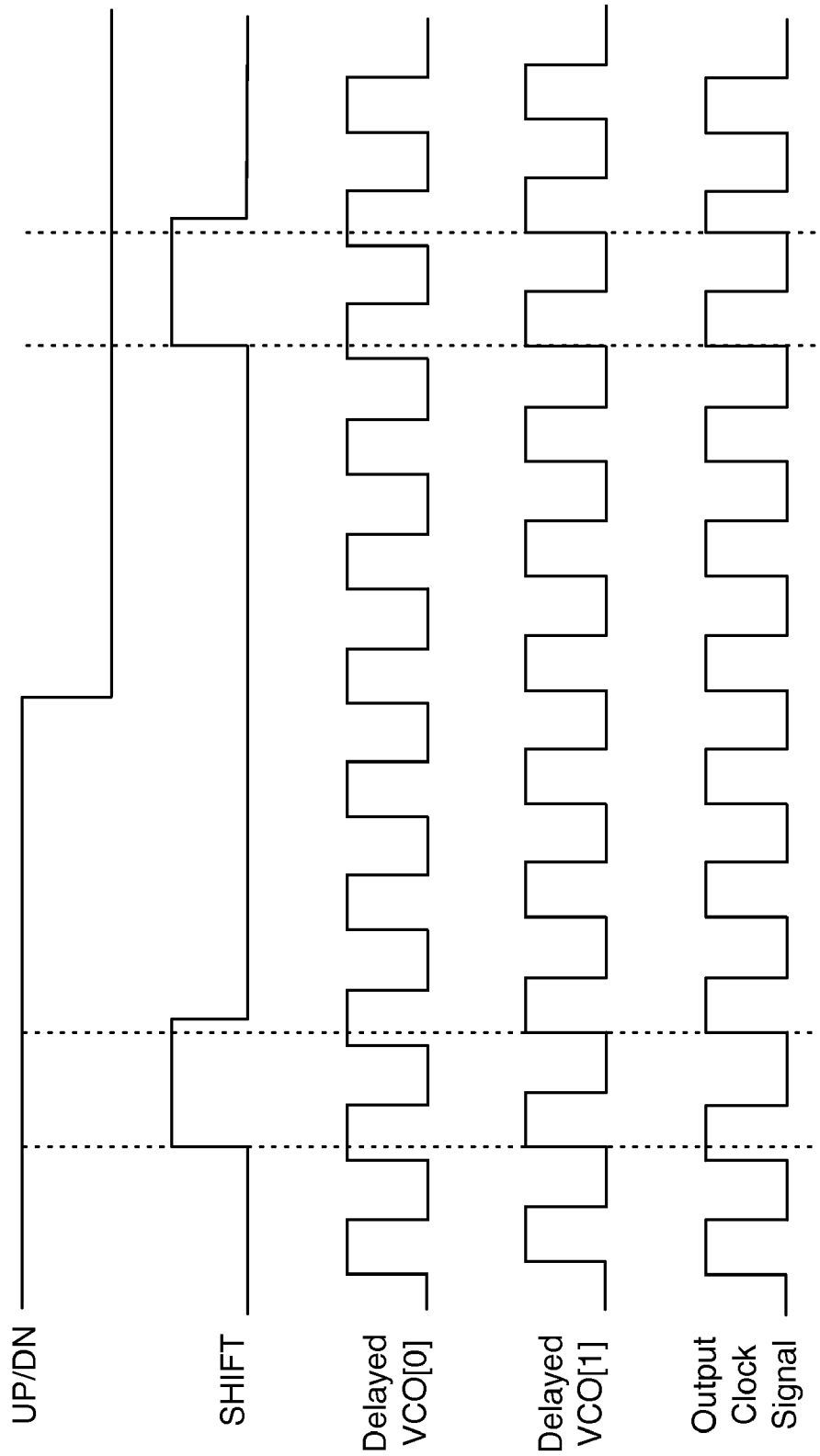
FIG. 2B is a timing diagram that illustrates an example of the operation of the phase shift circuit shown in FIG. 2A, according to an embodiment of the present invention.

FIG. 2B is a timing diagram that illustrates an example of the operation of phase shift circuit 200, according to an embodiment of the present invention. When the SHIFT signal transitions from low to high, and the UP/DN signal is high, barrel shifter 205 causes multiplexer 202 to switch from the first delayed VCO[0] output signal to the second delayed VCO[1] output signal of delay cell 201. Because the delay through delay cell 201 plus the delay through multiplexer 202 is equal to the delay through multiplexer 203 plus the delay through the flip-flops in barrel shifter 205, a glitch does not appear in the output clock signal of multiplexer 202. When the SHIFT signal transitions from low to high, and the UP/DN signal is low, barrel shifter 205 causes multiplexer 202 to switch from the second delayed VCO[1] output signal back to the first delayed VCO[0] output signal of delay cell 201.

According to some embodiments of the present invention, methods for phase shifting periodic output signals are provided. The method comprises delaying the periodic output signals using a delay circuit to generate delayed signals. The method also comprises selecting one of the delayed signals in response to first select signals using a first multiplexer to provide an output clock signal, and selecting one of the periodic output signals in response to second select signals using a second multiplexer. The method further comprises changing states of at least one of the first select signals in response to the selected periodic output signal to cause the first multiplexer to generate a phase shift in the output clock signal. The method can further comprise generating the first and the second select signals using a set of flip-flops in response to the selected periodic output signal.

According to additional embodiments of the present invention, the step of changing the states of at least one of the first select signals in response to the selected periodic output signal to cause the first multiplexer to generate the phase shift in the output clock signal further comprises changing the states of at least one of the first select signals in response to the selected periodic output signal using a barrel shifter circuit. According to further embodiments of the present invention, the barrel shifter circuit shifts a phase of the output clock signal in a first direction in response to a first logic state on a directional signal, and the barrel shifter circuit shifts a phase of the output clock signal in a second direction in response to a second logic state on the directional signal.

According to further embodiments of the present invention, the method further comprises adjusting a delay that the delay circuit provides to the delayed signals in response to at least one control signal to prevent glitches in the output clock signal. According to additional embodiments of the present invention, an oscillator in a phase-locked loop generates the periodic output signals, and the phase-locked loop is located on a programmable logic integrated circuit.

The periodic output signals of a voltage controlled oscillator (VCO) in a PLL typically have a valid operating frequency range. If the frequencies of the VCO output signals move outside the valid operating range, the performance of the VCO can degrade substantially. For example, a substantial amount of jitter may be introduced into the VCO output clock signals. Depending on the design margin of other circuitry in the PLL, some circuit blocks may not be able to keep up with an increased output frequency of the VCO, causing a functional failure in the PLL.

Many system applications require a phase-locked loop that can be reconfigured. For example, if the original PLL configuration does not accommodate a change in the input and output frequency requirements of the system, the PLL can be reconfigured to support the new input and output frequency requirements so that the PLL can continue to function properly. As another example, different performance requirements can also trigger the need for a PLL to be dynamically reconfigured. Also, a change in the noise injection from the input and power supply voltages, and/or a change in the input and output clock phase relationship or duty cycle can trigger a need to reconfigure the PLL.

According to another embodiment of the present invention, a phase-locked loop (PLL), a delay-locked loop (DLL), or another type of programmable circuit block in a programmable IC can be dynamically reconfigured while in the user mode, without having to reconfigure all of the other peripheral programmable circuit blocks on the IC. This embodiment of the present invention provides a time saving technique for dynamically reconfiguring a PLL or other programmable circuit block. This embodiment also allows a programmable IC to continue operating in user mode without shutting down, while the settings of a PLL or another type of circuit block in the IC are reconfigured. The programmable settings of a PLL or another peripheral circuit block can be reconfigured without having to also reconfigure all of the other peripheral circuit blocks on the IC.

Figure 3:
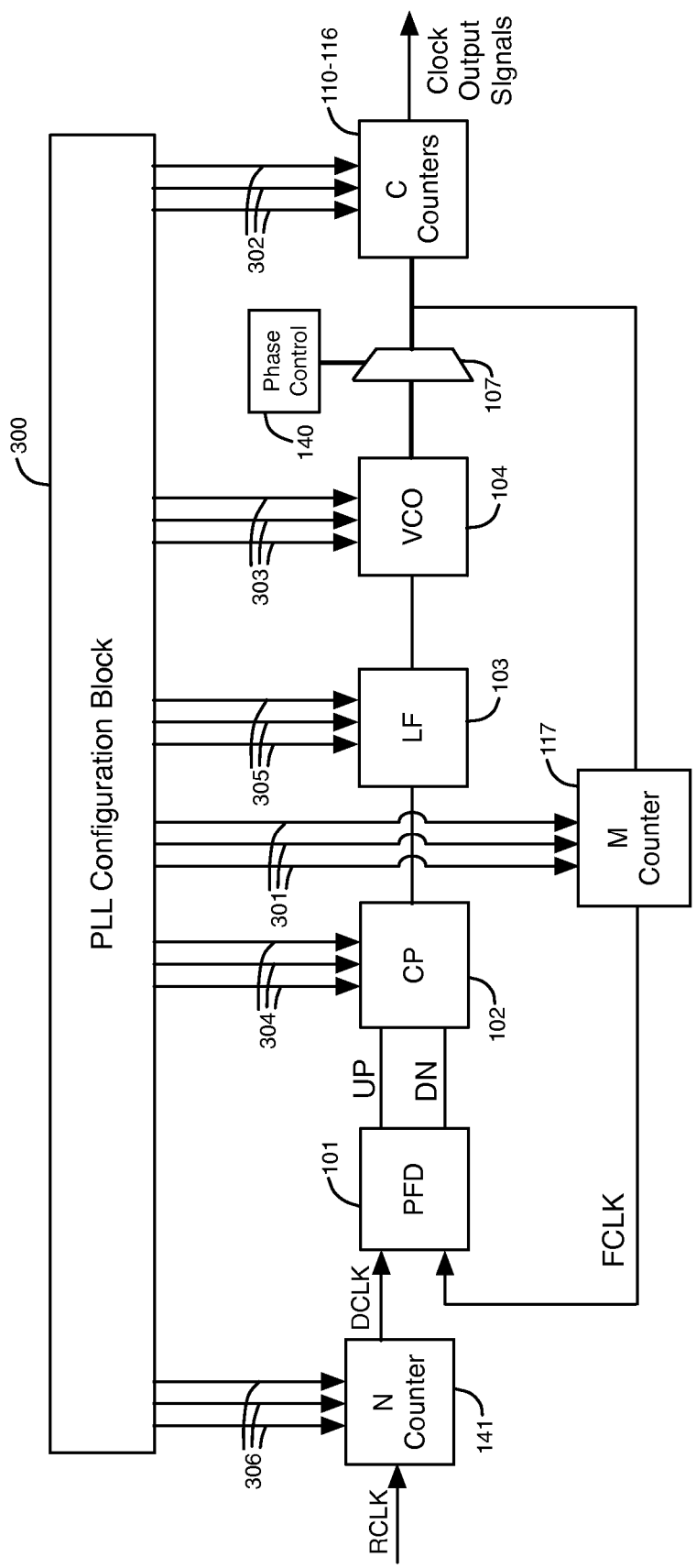
FIG. 3 illustrates a PLL configuration block that is used to configure circuit blocks in a PLL, according to another embodiment of the present invention.

FIG. 3 illustrates a PLL configuration block 300 generating a number of configuration signals that control several configurable settings of a PLL, according to another embodiment of the present invention. PLL configuration block 300 generates the configuration signals 301-306 using configuration data that is loaded into the PLL during configuration mode or during user mode. The states of configuration signals 301-306 are stored in memory in PLL configuration block 300. Although three arrows are shown in FIG. 3 for each set of configuration signals 301-306, each set of configuration signals 301-306 can include any desired number of configuration signals.

The techniques of the present invention allow discrete changes to be made in various performance characteristics of PLL 100 by loading in new PLL configuration data. For example, a discrete change in the input frequency of clock signal RCLK can be compensated for by changing frequency divider ratios of one or both of counters 117 and 141 to maintain the frequencies of the output signals of VCO 104 within their valid frequency operating range.

Several settings of PLL 100 can be reconfigured during user mode, including the frequency divider ratio N of the input counter 141, the frequency divider ratios C0-C6 of the output counters 110-116, and the frequency divider ratio M of feedback counter 117. By adjusting one or more of the frequency ratios N and/or M of counters 141 and 117 during user mode, PLL 100 can dynamically adjust the operating frequency range for reference clock signal RCLK that causes VCO 104 to generate output signal frequencies within its valid frequency operating range.

PLL configuration block 300 outputs configuration signals 301 for setting the frequency divider ratio M of feedback counter 117. PLL configuration block 300 outputs configuration signals 302 for setting the frequency divider ratios of output C counters 110-116. PLL configuration block 300 outputs configuration signals 306 for setting the frequency divider ratio N of input counter 141.

The frequency $F_{OUT}$ of the output signals of VCO 104 is a function of the frequency $F_{IN}$ of the reference clock signal RCLK, the frequency divider ratio N of counter 141, and the frequency divider ratio M of counter 117, as shown in equation (1).

$$F_{OUT} = \frac{F_{IN} \times M}{N} \quad (1)$$

New PLL configuration data can be loaded into PLL 100 using PLL configuration block 300 to adjust the frequency divider ratios N and/or M of PLL 100. The new frequency divider ratios N and/or M are selected to maintain the output signal frequencies of VCO 104 within its valid frequency range. As a result, PLL 100 can continue to maintain its performance characteristics (e.g., jitter characteristics) after discrete changes in the input frequency of reference clock signal RCLK. The frequency divider ratios C0-C6 of counters 110-116 can also be adjusted to change the frequencies of the PLL output signals using configuration signals 302.

All of counters 110-117 and 141 have adjustable frequency divider ratios, C0-C6, M, and N. A counter circuit that provides an adjustable frequency divider ratio can be, for example, a preset divide-by-N counter circuit. A preset divide-by-N counter circuit typically includes several flip-flops coupled together. The flip-flops are clocked by an input clock signal. For example, flip-flops in counter 141 are clocked by the RCLK clock signal. Signals representing the binary value of a desired frequency division ratio are loaded into the counter during a preset operation. The counter then counts down from the frequency division ratio binary value to zero (or counts up from zero to the frequency division ratio). The binary value of the output signals of the flip-flops is changed in response to edges of the input clock signal. When the counter finishes counting, the counter generates an edge on its output clock signal. The counter then begins to count down (or up) again. The frequency division ratio of the counter can be changed by loading signals having a different binary value into the counter.

Some system applications require that the duty cycles of the PLL clock output signals change dynamically to capture data. Each of the counters in the PLL of FIG. 3 receives configuration signals that determine the duty low count (e.g., the number of VCO cycles that the output clock signal remains low) and the duty high count (e.g., the number of VCO cycles that the output clock signal remains high). The duty cycle D of a clock signal is determined by equation (2).

$$D = \frac{CH}{(CH + CL)} \quad (2)$$

In equation (2), CH is the amount of time that the clock signal is high in a period of the clock signal, and CL is the amount of time that the clock signal is low in a period of the clock signal. Configuration signals 302 control the duty cycle of the output clock signals generated by the counter circuits 110-116. The duty cycle of the output clock signals can vary from 10% to 90%. PLL configuration block 300 can dynamically change the duty cycles of the output clock signals of the counter circuits while the PLL is in user mode.

The dynamic reconfiguration embodiments of the present invention also allow dynamic coarse phase shift, which is a phase shift by more than one VCO clock cycle. Each counter circuit receives configuration signals that allow the counter circuit to count after skipping a specific number of clock cycles from the VCO that represent the phase shift. By choosing a different number of skip cycles for the feedback M and output C counter circuits, coarse phase shift is possible so that the input clock and output clock signals can be more than one clock cycle apart. The dynamic configuration embodiments of the present invention allow the states of configuration signals 301-302 and 306 to be changed dynamically while the PLL is in use in a system (i.e., during user mode), thus allowing dynamic coarse phase shift.

Other blocks of the PLL system can also receive configuration signals from PLL configuration block 300. For example, CP 102 receives configuration signals 304 from block 300, LF 103 receives configuration signals 305 from block 300, and VCO 104 receives configuration signals 303 from block 300. Configuration signals 304 determine the amount of current that CP 102 provides to and drains from loop filter 103 in response to pulses on the UP and DN signals from PFD 101. Configuration signals 305 determine the resistance and the capacitance of LF 103. Further details of how the resistance and capacitance of LF 103 can be configured are described below with respect to FIG. 5. Configuration signals 303 determine the gain of VCO 104.

The bandwidth of a PLL is determined by the amount of charge pump current, the loop filter 103 resistance and capacitance, the feedback counter 117 frequency divider ratio, and the gain of VCO 104. The PLL bandwidth is an indication of how quickly the PLL responds to changes in the phase and frequency of the input reference clock signal RCLK. The bandwidth also indicates how much noise the PLL can reject from the input reference clock signal RCLK and within the PLL. The amount of PLL bandwidth is an important system requirement.

While a PLL is in use in a complex system or environment, the amount of noise and sources of noise that effect the system can change. The bandwidth of the PLL determines its noise rejection capability. In a system where noise from the input reference clock signal to the PLL is dominant, a low bandwidth helps to reject noise from the input reference clock signal. When the noise of the internal VCO or the power supply noise is dominant, a large bandwidth helps to reject the dominant noise.

While a PLL is in use in a system, the amount of noise and the sources of noise can change, causing the original configuration that represents a specific bandwidth to no longer be suitable. The configurable settings of CP 102, LF 103, VCO 104, and counters 110-116, 117, and 141 can be reconfigured by loading new configuration data into block 300 to adjust the bandwidth of the PLL until the PLL noise rejection is maximized, without exiting the user mode. The new configuration data controls the states of signals 301-306.

Figure 4:
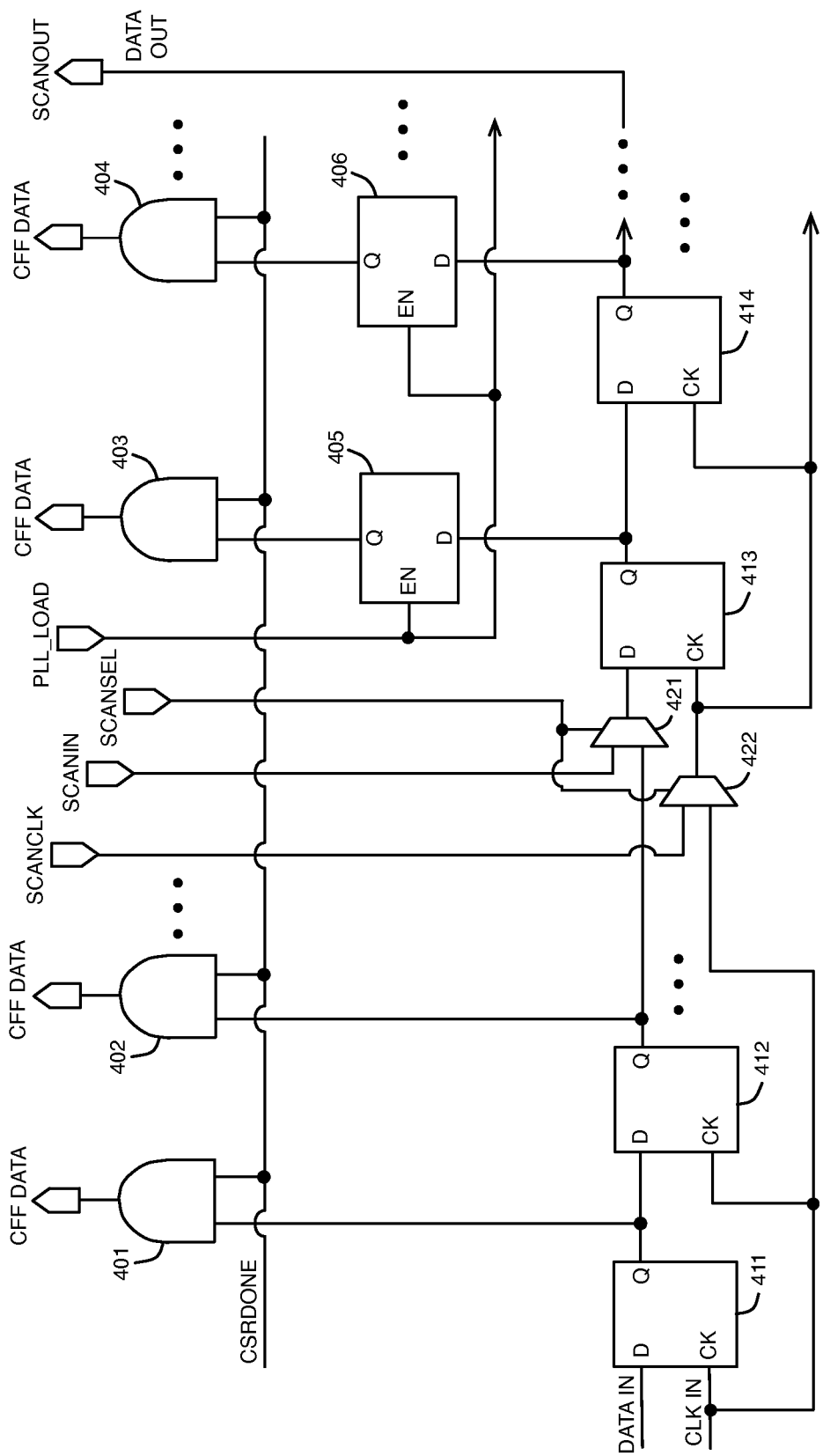
FIG. 4 illustrates circuitry that can be used in an integrated circuit (IC) to dynamically reconfigure a PLL or another type of programmable circuit block, according to another embodiment of the present invention.

FIG. 4 illustrates circuitry that can be used in an integrated circuit (IC) to dynamically reconfigure a PLL, DLL, or another type of programmable circuit block, according to another embodiment of the present invention. The circuitry shown in FIG. 4 is an example of a configuration block that can be used to configure and reconfigure the programmable settings of a configurable PLL, DLL, or another type of programmable circuit block. The circuitry shown in FIG. 4 is an example of PLL configuration block 300. The circuitry shown in FIG. 4 is typically used in a programmable logic integrated circuit. Although the circuitry of FIG. 4 can be used in any type of integrated circuit that has programmable circuit blocks.

The circuitry of FIG. 4 has a set of logic gates including AND gates 401-404, a set of configuration latches including latches 405-406, a set of input/output configuration shift registers (IOCSRs) including registers 411-414, and multiplexers 421-422. Inputs SCANCLK, SCANIN, and SCANSEL, and output SCANOUT can be coupled to pins of the integrated circuit (IC).

The IOCSRs, including registers 411-414, are flip-flops that store configuration data for configuring peripheral circuitry in a programmable logic IC, including a PLL such as PLL 100. IOCSRs are typically located around the periphery of the IC.

Only a subset of the AND gates, registers, and latches are shown in FIG. 4 to simplify the drawing. However, a programmable IC of the present invention can have hundreds or thousands of IOCSRs, PLL configuration latches, and corresponding AND gates. For example, if PLL 100 is designed to receive 300 configuration bits, the IC should have at least 300 PLL configuration latches, 300 IOCSRs for storing the PLL configuration data, and 300 corresponding AND gates.

During the configuration mode of the programmable logic IC, the SCANSEL control signal is driven to a logic state (e.g., from a pin) that causes the IOCSRs to accept configuration data from the DATA IN input. Specifically, SCANSEL is set to cause multiplexer 421 to couple the Q output of register 412 to the D input of register 413. SCANSEL also causes multiplexer 422 to transmit a clock signal at CLK IN to the clock inputs (CK) of registers 413, 414, etc.

After multiplexers 421-422 have been set as previously described, configuration data can be serially shifted into the IOCSRs through the DATA IN input during the configuration mode in the form of configuration bits. The configuration bits are serially shifted through the IOCSRs 411-414, etc. in response to edges of a clock signal. The clock signal is transmitted from the CLK IN input to the clock inputs (CK) of each of the IOCSR flip-flops during the configuration mode.

The configuration data that is loaded into the IOCSRs 413, 414, etc. between multiplexer 421 and the SCANOUT output is used to configure or reconfigure the programmable settings of PLL 100, as shown in FIG. 3. The configuration data stored in IOCSRs 413, 414, etc. up to the SCANOUT output is referred to as PLL configuration data.

A load signal at input PLL_LOAD is transmitted to the enable (EN) input of each of the PLL configuration latches 405, 406, etc. In response to an edge on a load signal at PLL_LOAD, the PLL configuration data is loaded into PLL configuration latches 405-406, etc. For example, flip-flops 405-406 store at their Q outputs the configuration data bits from registers 413-414 in response to a rising edge on the load signal at PLL_LOAD.

After the configuration data is loaded into the IOCSRs and the PLL configuration latches, the CSRDONE signal is pulled to a logic high in configuration mode, causing AND gates 401-404, etc. to transmit the configuration data bits to various peripherals circuits in the programmable IC. AND gates 403, 404, etc. transmit the PLL configuration data stored in PLL configuration latches 405, 406, etc. to PLL configuration block 300 for configuring the programmable settings of PLL 100. Alternatively, PLL configuration block 300 can include latches 405, 406, etc. and AND gates 403, 404, etc. AND gates 401, 402, etc. transmit the configuration data from registers 411, 412, etc. to other peripheral circuitry.

After the configuration mode is complete, the programmable logic IC is operated in a user mode, during which the IC performs the functions it has been programmed to perform by the configuration data.

According to an embodiment of the present invention, certain programmable settings of PLL 100 can be dynamically reconfigured during user mode using the architecture of FIG. 4, without having to reconfigure all of the other peripheral programmable circuit blocks on the IC. To reconfigure PLL 100, new configuration data is loaded into the IOCSRs that store the PLL configuration data. As mentioned above, these IOCSRs are located between multiplexer 421 and the SCANOUT output. IOCSRs 413-414 are examples of these registers.

According to some embodiments of the present invention, not all of the configurable settings in PLL 100 are user reconfigurable during the user mode. For example, some of the startup settings of the PLL can only be reconfigured in the configuration mode.

To initiate the dynamic reconfiguration process in the user mode, the SCANSEL signal is driven to a logic state that causes multiplexer 421 and multiplexer 422 to couple the SCANIN data input and the SCANCLK clock input to the D and CK inputs of register 413, respectively. During the dynamic reconfiguration process, new configuration scan data is serially loaded into IOCSRs 413, 414, etc. through multiplexer 421 from the SCANIN input during user mode. Also, a SCANCLK clock signal is driven to IOCSRs 413, 414, etc. through multiplexer 422 from the SCANCLK input. The SCANCLK clock signal clocks IOCSRs 413, 414, etc. during the dynamic reconfiguration process in user mode.

The SCANCLK, SCANIN, and SCANSEL inputs allow new PLL configuration data to be loaded into PLL 100 during user mode without re-loading configuration data into all of the IOCSRs. For example, because SCANIN is coupled to transmit data to register 413 through multiplexer 421 bypassing registers 411-412, new configuration data bits do not need to be re-loaded into IOCSRs 411-412.

After the new configuration data is loaded into IOCSRs 413, 414, etc., a signal at the PLL_LOAD input changes state, causing the PLL configuration latches 405-406, etc. to store the new PLL configuration data for PLL 100. Subsequently, the new PLL configuration data is transmitted to PLL configuration block 300 for dynamic reconfiguration of PLL 100 during user mode. AND gates 403, 404, etc. do not block the new PLL configuration data from being sent to PLL 100, because the CSRDONE signal remains high during user mode.

In the user mode, PLL 100 can be reconfigured to generate output signals that are within the valid operating frequency range of VCO 104 and other circuitry in the PLL. The valid operating frequency range of VCO 104 corresponds to a valid input frequency range for input clock signal RCLK. If it is known that the frequency of the input clock signal RCLK will deviate outside the valid input frequency range, one or more settings in PLL 100 can be reconfigured using new PLL configuration data that is loaded into the IC through the circuitry shown in FIG. 4.

Other settings of PLL 100 that are programmable include the duty cycle of the output and feedback counters 110-117, the resistance of loop filter 103, the capacitance of loop filter 103, the output current of charge pump 102, and the gain of VCO 104. Any of these features of PLL 100 can be configured during configuration mode and reconfigured during user mode using the circuitry of FIG. 4.

The bandwidth of PLL 100 is proportional to the resistance in loop filter 103, the current generated by charge pump 102, the gain of VCO 104, and the inverse of the frequency divider ratio M of counter 117. The bandwidth of PLL 100 can be changed by adjusting one or more of the frequency divider ratio M of counter 117, the resistance and capacitance of loop filter 103, the output current of charge pump 102, and/or the gain of VCO 104.

As an example, the bandwidth of PLL 100 can be set to a low value to reject noise in the input reference clock signal, and the bandwidth of PLL 100 can be set to a high value to reject noise from the VCO. These changes to the PLL settings can be implemented by loading new configuration bits into the IOCSRs and block 300 during user mode.

Figure 5:
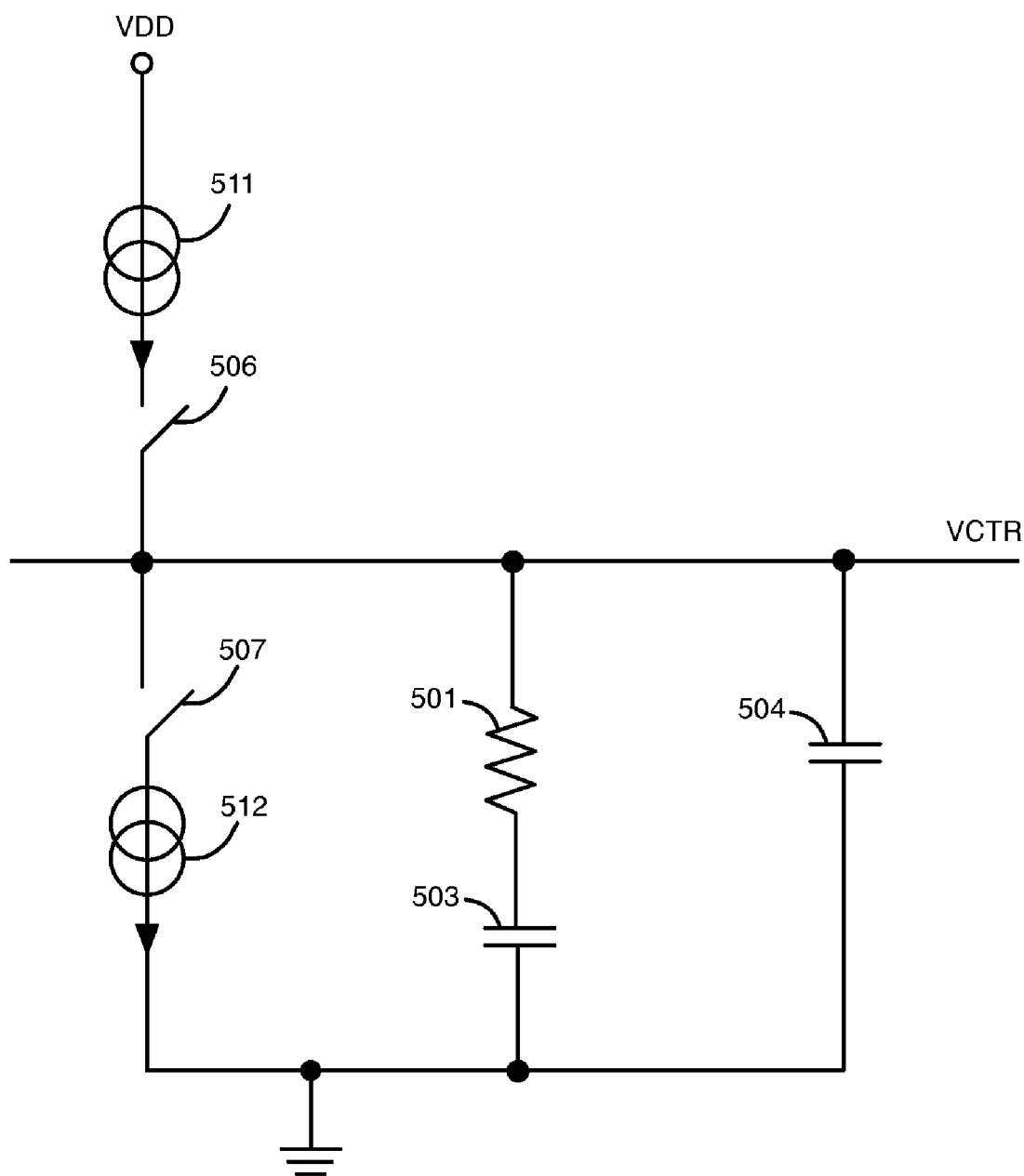
FIG. 5 illustrates an example of a loop filter having a variable resistance and a variable capacitance that can be adjusted by PLL configuration data, according to an embodiment of the present invention.

FIG. 5 illustrates an example of a loop filter 500 with a variable resistance and a variable capacitance that can be adjusted by PLL configuration data, according to an embodiment of the present invention. The loop filter 500 of FIG. 5 is an example of loop filter 103 shown in FIGS. 1A and 3.

The resistance of loop filter 500 is implemented by a network of resistors. Resistor 501 shown in FIG. 5 represents a network of resistors that are coupled together in series. A pass gate (not shown) is coupled in parallel with each of the resistors. Resistor configuration bits selectively turn on or off the pass gates to effect the net resistance of loop filter 500. The resistor configuration bits are transmitted to loop filter 500 from PLL configuration block 300 as configuration signals 305. The resistance of the resistor network in loop filter 500 can be changed during user mode by shifting new resistor configuration bits into IOCSRs 413, 414, etc. through the SCANIN input.

According to another embodiment of the present invention, the resistance and/or the capacitance of loop filter 500 can be changed to effect the bandwidth of PLL 100. For example, the bandwidth of PLL 100 can be changed to a new value. Alternatively, the bandwidth of PLL 100 can be maintained at a constant value after the frequency divider ratio M of counter 117 has been changed. The capacitance of loop filter 500 can also be adjusted to maintain the stability of PLL 100 after one or more of the frequency divider ratios of counter circuits 141 and 117 have been changed.

In the embodiment of FIG. 5, the capacitance of loop filter 500 is implemented by a network of capacitors that are coupled together in parallel. Capacitor 504 represents the network of capacitors. Pass gates (not shown) are coupled to capacitors 504. Capacitor configuration bits selectively turn the pass gates on or off to effect the net capacitance of loop filter 500. The capacitor configuration bits are transmitted to loop filter 500 from PLL configuration block 300 as configuration signals 305. The capacitance of loop filter 500 can be adjusted by loading new PLL configuration bits into IOCSRs 413, 414, etc. through the SCANIN input during user mode, as described above.

Loop filter 500 also includes capacitor 503, which is coupled in series with resistor 501. Current source 511 and switch 506 represent charge pump 102 supplying current to loop filter 500 in response to UP pulses. Current source 512 and switch 507 represent current draining from loop filter 500 in response to DN pulses.

Figure 6:
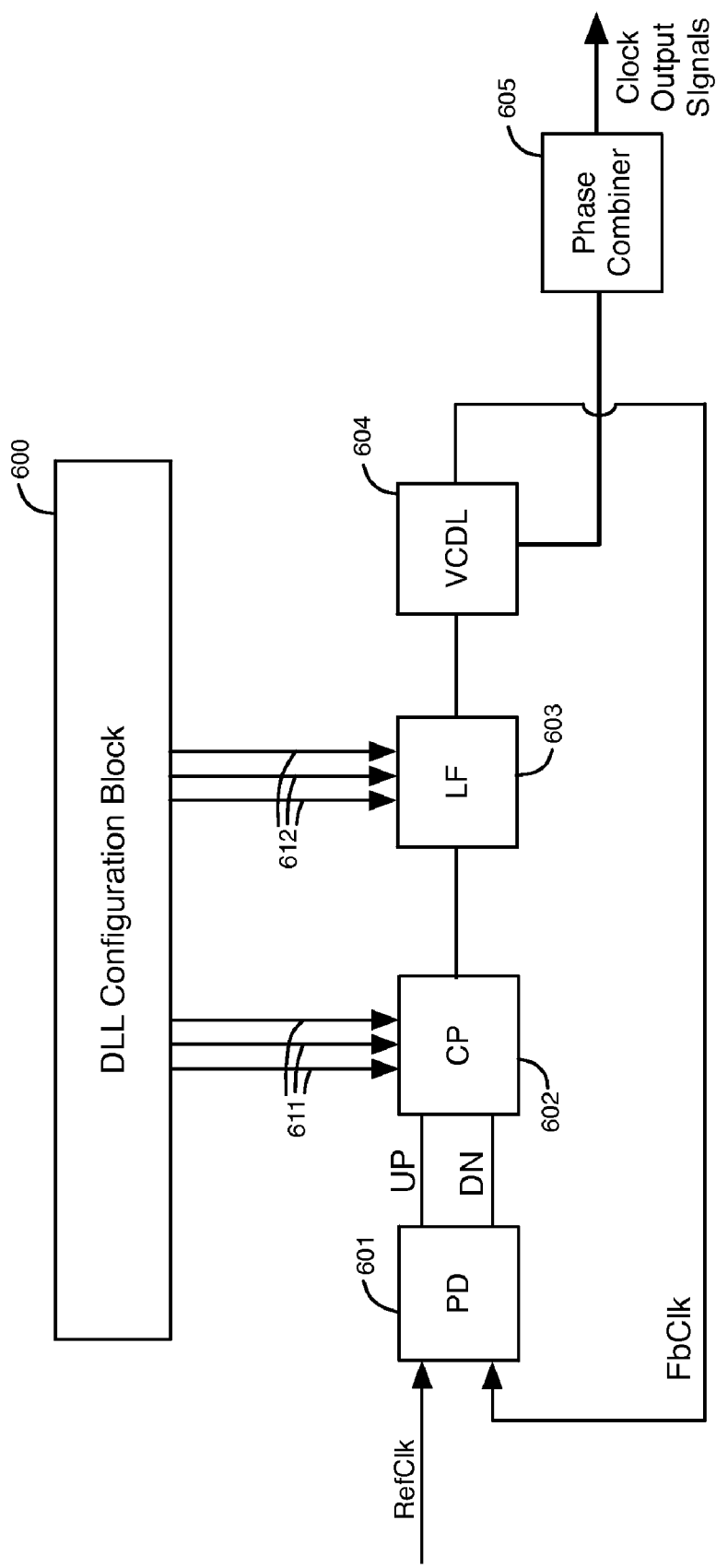
FIG. 6 illustrates a DLL configuration block that generates configuration signals for controlling configurable settings of a delay-locked loop (DLL), according to another embodiment of the present invention.

FIG. 6 illustrates a DLL configuration block 600 that generates configuration signals for controlling configurable settings of a delay-locked loop (DLL), according to another embodiment of the present invention. The DLL of FIG. 6 includes a phase detector (PD) 601, a charge pump (CP) 602, a loop filter (LF) 603, a voltage controlled delay line (VCDL) 604, and a phase combiner circuit 605.

The circuitry shown in FIG. 4 can be used to implement DLL configuration block 600. DLL configuration block 600 generates configuration signals 611-612. DLL configuration block 600 generates configuration signals 611-612 using configuration data that is loaded into the DLL during configuration mode or user mode. DLL configuration block 600 can re-load new configuration data during user mode to reconfigure the programmable settings of the DLL as discussed above with respect to FIG. 4.

Configuration signals 611 are used to control the configurable settings of charge pump 602. Configuration signals 612 are used to control the configurable settings of loop filter 603, such as its resistance and/or capacitance. DLL configuration block 600 can also transmit other configuration signals to the DLL of FIG. 6 to configure additional programmable settings of the DLL.

Figure 7:
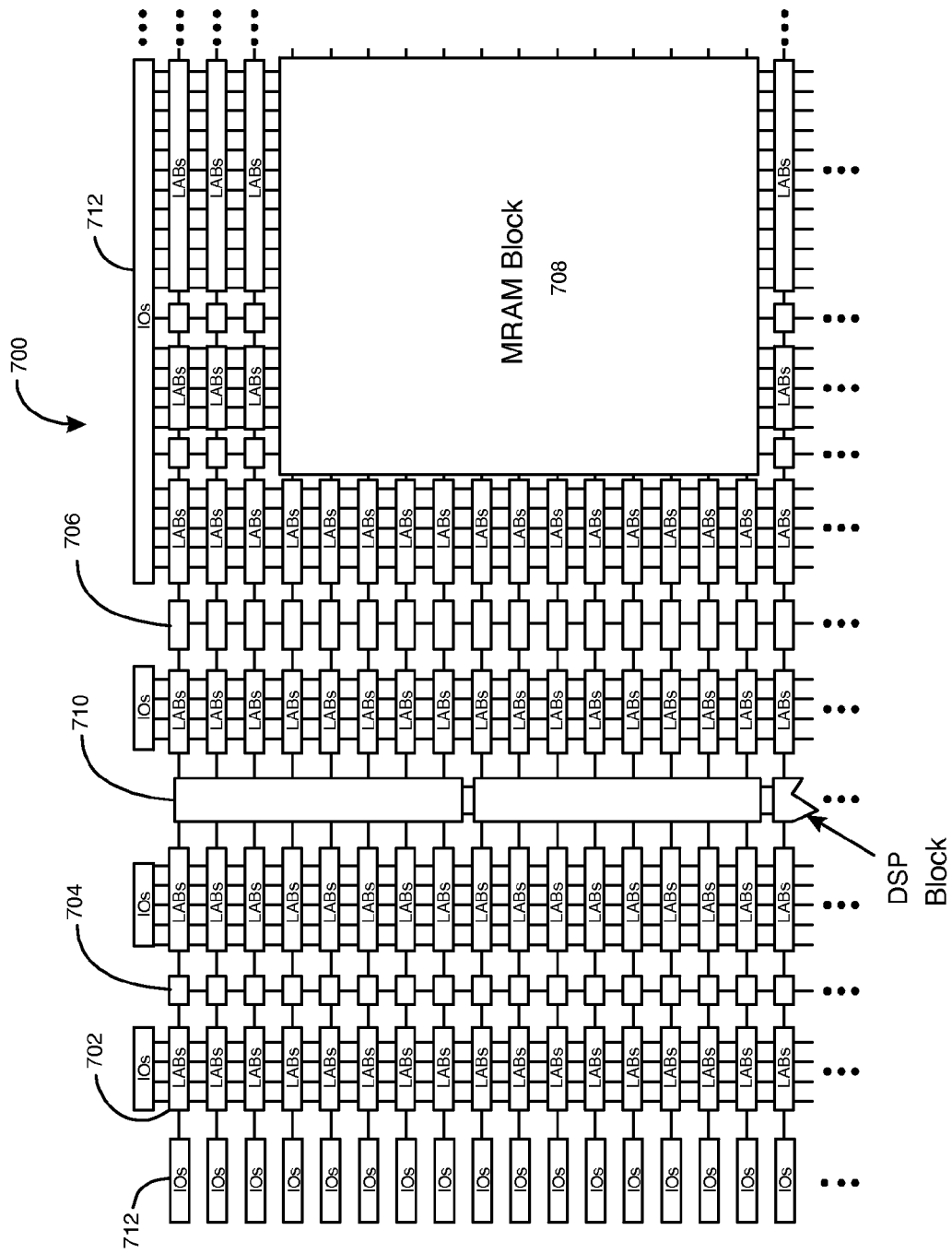
FIG. 7 is a simplified block diagram of a field programmable gate array (FPGA) that can embody the techniques of the present invention.

FIG. 7 is a simplified partial block diagram of an FPGA 700 that can include aspects of the present invention. FPGA 700 is merely one example of an integrated circuit that can include features of the present invention. It should be understood that embodiments of the present invention can be used in numerous types of integrated circuits, including programmable logic integrated circuits and application specific integrated circuits (ASICs). Programmable logic integrated circuits include, for example, field programmable gate arrays (FPGAs), programmable logic devices (PLDs), complex programmable logic devices (CPLDs), and programmable logic arrays (PLAs).

FPGA 700 includes a two-dimensional array of programmable logic array blocks (or LABs) 702 that are interconnected by a network of column and row interconnect conductors of varying length and speed. LABs 702 include multiple (e.g., 10) logic elements (or LEs).

An LE is a programmable logic block that provides for efficient implementation of user defined logic functions. An FPGA has numerous logic elements that can be configured to implement various combinatorial and sequential functions. The logic elements have access to a programmable interconnect structure. The programmable interconnect structure can be programmed to interconnect the logic elements in almost any desired configuration.

FPGA 700 also includes a distributed memory structure including RAM blocks of varying sizes provided throughout the array. The RAM blocks include, for example, blocks 704, blocks 706, and block 708. These memory blocks can also include shift registers and FIFO buffers.

FPGA 700 further includes digital signal processing (DSP) blocks 710 that can implement, for example, multipliers with add or subtract features. IO blocks (IOs) 712 located, in this example, around the periphery of the chip support numerous single-ended and differential input/output standards. The IO blocks 712 contain IO buffers and are typically grouped into IO banks. It is to be understood that FPGA 700 is described herein for illustrative purposes only and that the present invention can be implemented in many different types of PLDs, FPGAs, and the like.

Figure 8:
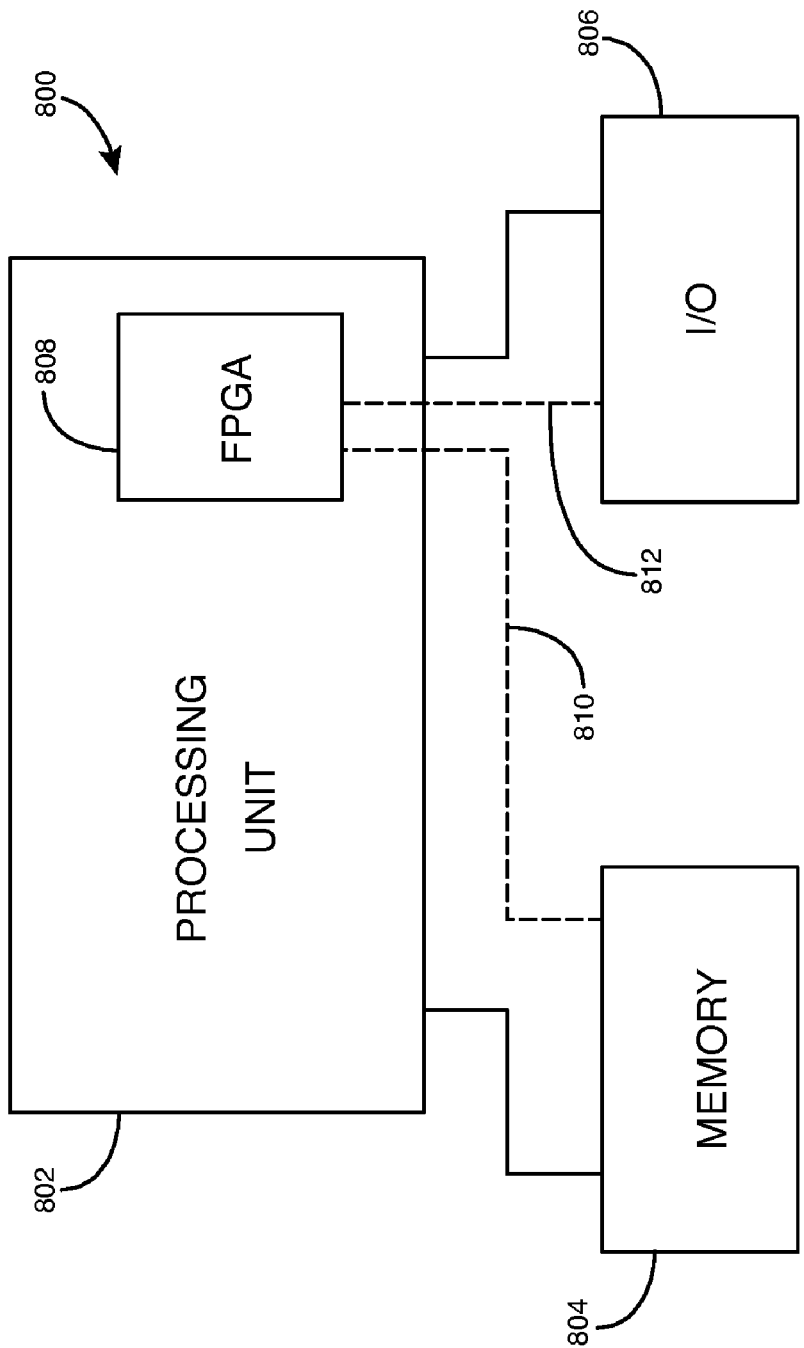
FIG. 8 is a block diagram of an electronic system that can implement embodiments of the present invention.

The present invention can also be implemented in a system that has an FPGA as one of several components. FIG. 8 shows a block diagram of an exemplary digital system 800 that can embody techniques of the present invention. System 800 can be a programmed digital computer system, digital signal processing system, specialized digital switching network, or other processing system. Moreover, such systems can be designed for a wide variety of applications such as telecommunications systems, automotive systems, control systems, consumer electronics, personal computers, Internet communications and networking, and others. Further, system 800 can be provided on a single board, on multiple boards, or within multiple enclosures.

System 800 includes a processing unit 802, a memory unit 804 and an I/O unit 806 interconnected together by one or more buses. According to this exemplary embodiment, an FPGA 808 is embedded in processing unit 802. FPGA 808 can serve many different purposes within the system in FIG. 8. FPGA 808 can, for example, be a logical building block of processing unit 802, supporting its internal and external operations. FPGA 808 is programmed to implement the logical functions necessary to carry on its particular role in system operation. FPGA 808 can be specially coupled to memory 804 through connection 810 and to I/O unit 806 through connection 812.

Processing unit 802 can direct data to an appropriate system component for processing or storage, execute a program stored in memory 804 or receive and transmit data via I/O unit 806, or other similar function. Processing unit 802 can be a central processing unit (CPU), microprocessor, floating point coprocessor, graphics coprocessor, hardware controller, microcontroller, field programmable gate array programmed for use as a controller, network controller, or any type of processor or controller. Furthermore, in many embodiments, there is often no need for a CPU.

For example, instead of a CPU, one or more FPGAs 808 can control the logical operations of the system. As another example, FPGA 808 acts as a reconfigurable processor, which can be reprogrammed as needed to handle a particular computing task. Alternately, FPGA 808 can itself include an embedded microprocessor. Memory unit 804 can be a random access memory (RAM), read only memory (ROM), fixed or flexible disk media, flash memory, tape, or any other storage means, or any combination of these storage means.

The foregoing description of the exemplary embodiments of the present invention has been presented for the purposes of illustration and description. It is not intended to be exhaustive or to limit the present invention to the precise form disclosed. A latitude of modification, various changes, and substitutions are intended in the present invention. In some instances, features of the present invention can be employed without a corresponding use of other features as set forth. Many modifications and variations are possible in light of the above teachings, without departing from the scope of the present invention. It is intended that the scope of the present invention be limited not with this detailed description, but rather by the claims appended hereto.

The invention claimed is:

1. An integrated circuit, comprising:
   first and second configuration scan registers;
   a first selector that transmits first configuration bits from the first configuration scan registers to the second configuration scan registers during a configuration mode, and that transmits second configuration bits from a first pin to the second configuration scan registers during a user mode; and
   a programmable circuit block configured to receive the first and the second configuration bits from the second configuration scan registers, wherein the first and the second configuration bits configure programmable settings of the programmable circuit block.

2. The integrated circuit defined in claim 1 wherein the programmable circuit block is a phase-locked loop.

3. The integrated circuit defined in claim 2 wherein the phase-locked loop comprises a counter circuit and the first and the second configuration bits configure a frequency divider ratio of the counter circuit.

4. The integrated circuit defined in claim 2 wherein the phase-locked loop comprises a loop filter and the first and the second configuration bits configure at least one of a resistance and a capacitance of the loop filter.

5. The integrated circuit defined in claim 2 wherein the phase-locked loop comprises a charge pump and the first and the second configuration bits configure a current of the charge pump.

6. The integrated circuit defined in claim 2 wherein the phase-locked loop comprises an oscillator, and the first and the second configuration bits configure a gain of the oscillator.

7. The integrated circuit defined in claim 1 further comprising:
   a second selector that transmits a first clock signal to the second configuration scan registers during the configuration mode, and that transmits a second clock signal from a second pin to the second configuration scan registers during the user mode.

8. The integrated circuit defined in claim 7 wherein the first selector has a select input that receives a signal from a third pin, and the second selector has a select input that receives the signal from the third pin.

9. The integrated circuit defined in claim 1 further comprising:
   latches having inputs that are coupled to receive the first and the second configuration bits from the second configuration registers; and
   logic gates, wherein the logic gates are coupled to transmit the first and the second configuration bits from the latches to the programmable circuit block.

10. A method for reconfiguring a programmable circuit block on a programmable integrated circuit, the method comprising:
    loading first configuration bits from first configuration scan registers into second configuration scan registers through a first multiplexer during a configuration mode;
    configuring programmable settings of the programmable circuit block using the first configuration bits;

loading second configuration bits into the second configuration scan registers through a first pin and the first multiplexer during a user mode without transmitting the second configuration bits through the first configuration scan registers; and reconfiguring the programmable settings of the programmable circuit block using the second configuration bits.

11. The method defined in claim 10 wherein the programmable circuit block is a phase-locked loop.

12. The method defined in claim 11 wherein reconfiguring the programmable settings of the programmable circuit block using the second configuration bits further comprises reconfiguring a frequency divider ratio of a counter circuit in the phase-locked loop using the second configuration bits.

13. The method defined in claim 11 wherein reconfiguring the programmable settings of the programmable circuit block using the second configuration bits further comprises reconfiguring at least one of a resistance and a capacitance of a loop filter in the phase-locked loop using the second configuration bits.

14. The method defined in claim 11 wherein reconfiguring the programmable settings of the programmable circuit block using the second configuration bits further comprises reconfiguring a current of charge pump in the phase-locked loop using the second configuration bits.

15. The method defined in claim 10 further comprising:
transmitting a first clock signal from a clock input to the second configuration scan registers through a second multiplexer during the configuration mode; and
transmitting a second clock signal from a second pin to the second configuration scan registers through the second multiplexer during the user mode.

16. The method defined in claim 10 further comprising:
transmitting the first and the second configuration bits from the second configuration scan registers to latches; and
transmitting the first and the second configuration bits from the latches to the programmable circuit block through logic gates.

17. A circuit comprising:
first configuration scan registers;
second configuration scan registers;
a first multiplexer, wherein first configuration bits are serially loaded from the first configuration scan registers through the first multiplexer into the second configuration scan registers when a select signal is in a first state, and wherein second configuration bits are serially loaded from a first pin through the first multiplexer into the second configuration scan registers when the select signal is in a second state; and
a programmable circuit block configured to receive the configuration bits stored in the second configuration scan registers, wherein the programmable circuit block comprises programmable settings that are configured by the configuration bits.

18. The circuit defined in claim 17 wherein the programmable circuit block is a phase-locked loop.

19. The circuit defined in claim 17 wherein the programmable circuit block is a delay-locked loop.

20. The circuit defined in claim 17 further comprising:
a second multiplexer that transmits a first clock signal to the second configuration scan registers when the select signal is in the first state, and that transmits a second clock signal from a second pin to the second configuration scan registers when the select signal is in the second state.

21. The circuit defined in claim 17 wherein the circuit is fabricated on a programmable logic integrated circuit.

* * * * *